US009552269B2

(12) United States Patent
Das Sharma et al.

(10) Patent No.: US 9,552,269 B2
(45) Date of Patent: Jan. 24, 2017

(54) TEST LOGIC FOR A SERIAL INTERCONNECT

(71) Applicant: Intel Corporation, Santa Clara, CA (US)

(72) Inventors: Debendra Das Sharma, Saratoga, CA (US); Daniel S. Froelich, Portland, OR (US)

(73) Assignee: Intel Corporation, Santa Clara, CA (US)

(*) Notice: Subject to any disclaimer, the term of this patent is extended or adjusted under 35 U.S.C. 154(b) by 203 days.

(21) Appl. No.: 14/581,000

(22) Filed: Dec. 23, 2014

(65) Prior Publication Data

US 2016/0179647 A1   Jun. 23, 2016

(51) Int. Cl.
| | |
|---|---|
| G06F 11/263 | (2006.01) |
| G06F 11/22 | (2006.01) |
| G06F 13/42 | (2006.01) |
| G06F 13/40 | (2006.01) |
| G06F 13/00 | (2006.01) |
| H04L 1/00 | (2006.01) |
| H03M 13/09 | (2006.01) |

(52) U.S. Cl.
CPC ......... *G06F 11/263* (2013.01); *G06F 11/221* (2013.01); *G06F 13/00* (2013.01); *G06F 13/4022* (2013.01); *G06F 13/4027* (2013.01); *G06F 13/42* (2013.01); *G06F 13/4282* (2013.01); *H03M 13/09* (2013.01); *H04L 1/0083* (2013.01)

(58) Field of Classification Search
CPC  G06F 11/263; G06F 13/4282; G06F 13/4027; G06F 13/4022; G06F 11/221; G06F 13/42; G06F 13/00; H03M 13/09; H04L 1/0083

USPC ......... 714/716, 712, 736; 370/222, 242, 249
See application file for complete search history.

(56) References Cited

U.S. PATENT DOCUMENTS

| | | | | |
|---|---|---|---|---|
| 7,852,757 | B1* | 12/2010 | Puranik | H04L 47/10 370/229 |
| 9,229,897 | B2* | 1/2016 | Iyer | G06F 13/4291 |
| 2006/0268724 | A1* | 11/2006 | Viswanath | G06F 11/26 370/242 |
| 2009/0113082 | A1* | 4/2009 | Adar | G06F 13/387 710/15 |
| 2013/0067127 | A1* | 3/2013 | Hopgood | G06F 13/00 710/104 |
| 2014/0006677 | A1* | 1/2014 | Iyer | G06F 13/4291 710/316 |

(Continued)

OTHER PUBLICATIONS

Das Sharma, Debendra, "PCIe® 3.0 PHY Logical Layer Requirements", PCIe Technology Seminar, Feb. 2008, 28 pages.

(Continued)

*Primary Examiner* — John J Tabone, Jr.
(74) *Attorney, Agent, or Firm* — International IP Group, P.L.L.C.

(57) ABSTRACT

An apparatus that includes a serial interconnect is provided, wherein the serial interconnect includes test logic to send a number of reporting messages, wherein each reporting message is associated with a link sub-segment in a link in the serial interconnect, and each reporting message comprises a status region for the associated link sub-segment to report transmission errors. The test logic also includes analysis logic to record errors in the link sub-segment.

25 Claims, 8 Drawing Sheets

(56) References Cited

U.S. PATENT DOCUMENTS

| | | | | |
|---|---|---|---|---|
| 2014/0281070 | A1* | 9/2014 | Natu | G06F 12/06 |
| | | | | 710/105 |
| 2015/0067208 | A1* | 3/2015 | Iyer | G06F 13/42 |
| | | | | 710/105 |
| 2015/0117504 | A1* | 4/2015 | Harriman | G06F 13/00 |
| | | | | 375/224 |
| 2015/0278040 | A1* | 10/2015 | Sikkink | G06F 11/2002 |
| | | | | 714/5.1 |
| 2015/0280746 | A1* | 10/2015 | Sikkink | H03M 13/17 |
| | | | | 714/762 |
| 2016/0050301 | A1* | 2/2016 | Dreps | H04L 69/321 |
| | | | | 370/458 |
| 2016/0179730 | A1* | 6/2016 | Halleck | G06F 13/4282 |
| | | | | 710/105 |
| 2016/0182154 | A1* | 6/2016 | Fang | H04B 10/2575 |
| | | | | 398/116 |

OTHER PUBLICATIONS

Froelich, et al., "Data Rate Detection to Simplify Retimer Logic", Utility U.S. Appl. No. 14/582,105, filed Dec. 23, 2014.

Froelich, et al., "Interconnect Retimer Enhancements", WO Patent Application No. PCT/US2013/077806, filed on Dec. 26, 2013, pp. 1-76.

Wagh, Mahesh, "PCIe®3.0 Encoding & PHY Logical", PCI-SIG Developers Conference Asia-Pacific Tour 2011, Sep. 2011, 28 pages.

* cited by examiner

TEST LOGIC FOR A SERIAL INTERCONNECT

FIELD

This disclosure pertains to computing system, and in particular, but not exclusively, to circuitry for testing serial communications in computing systems.

BACKGROUND

As computing systems are advancing, the components therein are becoming more complex. As a result, the interconnect architecture to couple and communicate between the components is also increasing in complexity to ensure bandwidth requirements are met for optimal component operation. Furthermore, different market segments need different interconnect architectures to suit the market's needs. For example, servers require higher performance, while the mobile ecosystem is sometimes able to sacrifice overall performance for power savings.

High speed serial interconnect links are used for in system communications between processors, disks, external interfaces, and numerous other units. These links may need to be coherent, e.g., ensuring identical memory contents in different locations. The serial interconnect links can include links between processor cores on a single die, for example, an intra-device interconnect (IDI). This provides a high-speed, low latency connection, but is not generally suitable for longer connection lengths.

Communications between chips that may be located on a single board or backplane may use a more suitable interconnection, such as the quick-path interconnect (QPI) from Intel®, the ultra-path interconnect (HPI) from Intel®, or similar protocols. These interconnections may be more complex than IDI, but provide fast communications between proximate devices. The proximate location of the devices for the IDI and QPI allow a shared clock signal, which can lower complexity and latency, and allow hardware synchronization, for example, through a drift buffer.

Longer distance communications, for example, across multiple boards or even cables between device cabinets, may use the peripheral component interconnect express (PCIe) protocol, which provides stable communications, and allows the use of extension devices. This communications protocol does not use a shared clock signal, but uses a software communications protocol to compensate for the timing differences that may be present. This allows synchronization of data through a software controlled buffer termed an elastic buffer. Further, the PCIe standard uses an error encoding technique that allows the recognition and correction of errors, such as 8b/10b or 128b/130b. These encoding techniques increase the accuracy of the transmission, but increase latency and decrease total throughput.

In high-speed serial links, an important aspect of ensuring link functionality is the ability to test the link. One of the ways this is traditionally done is with Loopback testing. One of the devices acts as the Loopback master while another device acts as the slave. The Loopback master sends a pattern that the slave sends back to the master. The master then checks the received pattern against the transmitted pattern and any variation indicates an error in communications.

DETAILED DESCRIPTION

The loopback testing procedure has limitations in identifying and locating faults, especially in communications that have extension devices such as repeaters and retimers. Since the device used as the loopback master does the checking in an end-to-end process, e.g., sending out test patterns and comparing test patterns received, it has no way of knowing which direction encountered the error, e.g., in the upstream or the downstream direction. The diagnosis of where the errors occurred gets even more difficult when re-timers are present in the link to extend the channel reach because end to end loopback does not provide information to determine which receiver(s) encountered errors.

Further, loopback testing is not done in normal operation, for example, in an L0 link state, but in a dedicated loopback test state. The set-up for the loopback state can be different than normal link operation and it may be hard to ensure that behavior in the loopback mode, and hardware settings, are the same as in normal operation. The test set-up for loopback may also be based on an assumption-based training as opposed to a hand-shake based training, including equalization steps in the normal operation. As a result, there may be gap in the link characterization in the loopback state versus the normal operating state, or L0 link state during normal operation.

There is also no mechanism to detect, and report, which link sub-segment or lane experiences errors so that preventive actions, such as link width or speed degradation may be initiated. This problem is even more difficult when extension devices, e.g., re-timers, are used. In addition to this, no direct mechanism exists for a retimer to request a link retraining or recovery even if the retimer has identified a need to retrain the circuitry to get the link sub-segment healthy. As used herein, a link sub-segment is one of the two transmission links that form a link segment between devices. For example, a link segment may include a transmission path and a receive path between two devices. Either one of these two paths may be considered a link sub-segment of the link segment.

Techniques described herein may address these limitations through different mechanisms. In one embodiment, a pre-determined pattern is sent by each transmitter that is on the link. Thus, each receiver knows what to expect and can detect errors on a bit level granularity. Further, each component in a link always transmits the expected pattern, irrespective of any errors it may have received, so errors are not propagated. Accordingly, errors may be identified by specific receivers on the link.

Error reporting is done periodically through special patterns, such as enhanced SKP ordered sets in PCI Express, L0c flits in high performance interconnects (HPI) such as quick path interconnect (QPI) or ultra-path interconnect (UPI) from Intel® corporation. Analysis of the sets to identify the errors may be performed by an upstream component, for example, operating as an enhanced loopback (ELB) master.

The errors may be recorded in configuration registers. The configuration registers may also be used for entry to a testing mode after the link enters normal communications, e.g., the L0 state, through the normal training sequence, while maintaining the ability to have a by-pass mechanism to skip the testing mode. For detecting errors during run-time traffic, a second mechanism may use a per-lane CRC or parity bit that is periodically sent, wherein the receiver at each link sub-segment detects and reports errors.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages, and operations in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to interconnect communications in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from a testing circuit. For example, the disclosed embodiments are not limited to servers, but may also be used in cloud computing networks, networked computers, desktop computer systems, or portable computer systems. Embodiments may be used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below.

One interconnect fabric architecture includes the Peripheral Component Interconnect (PCI) Express (PCIe) architecture. A primary goal of PCIe is to enable components and devices from different vendors to inter-operate in an open architecture that spans multiple market segments, clients (Desktops and Mobile), Servers (Standard and Enterprise), and embedded and communication devices. PCIe is a high performance, general purpose input/output (I/O) interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCIe take advantage of advances in point-to-point interconnects, Switch-based technology, and packetized protocol to deliver new levels of performance and features. Power management, quality of service (QoS), hot-plug/hot-swap support, data integrity, and error handling are among some of the advanced features supported by PCIe.

Figure 1:
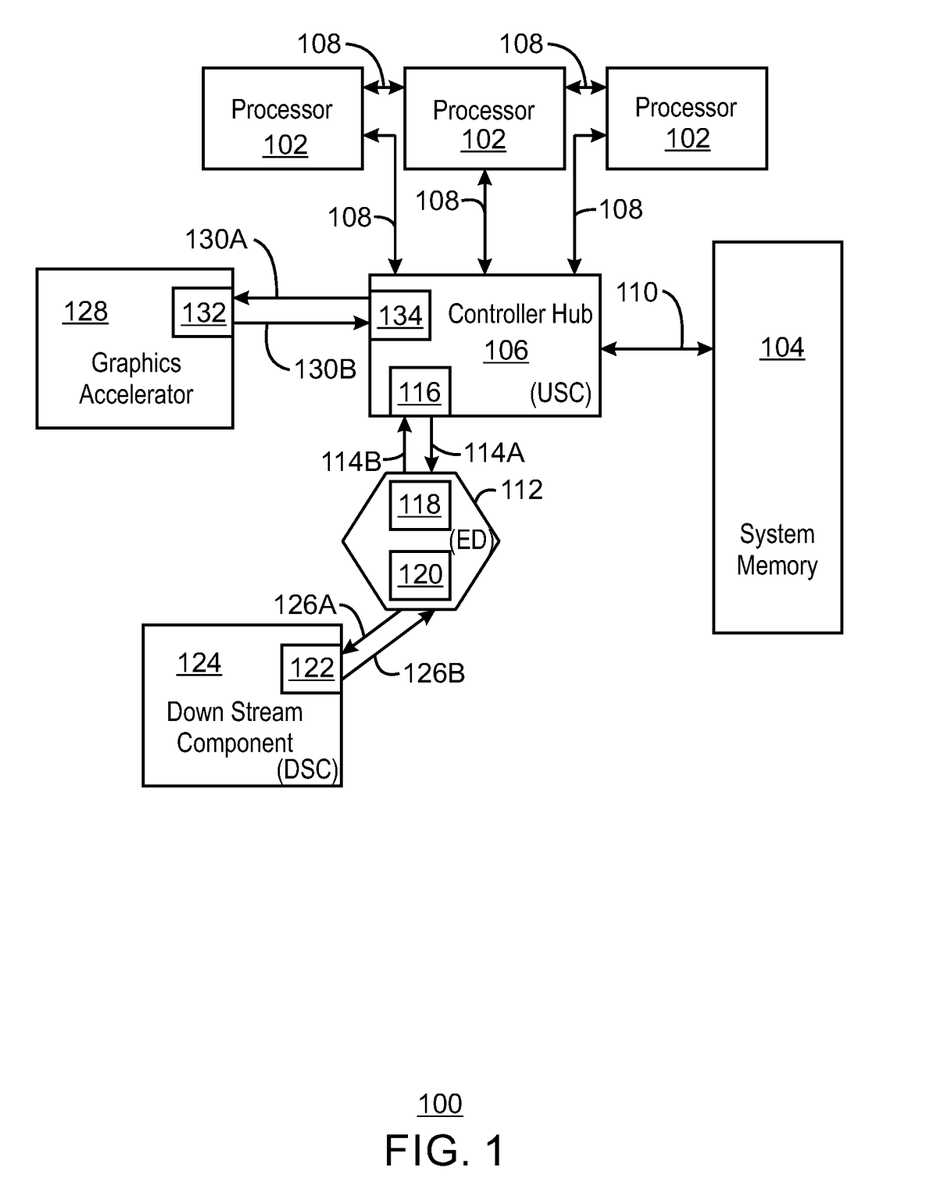
FIG. 1 is a block diagram of an embodiment of a computing system that includes point-to-point links that interconnect a set of components.

FIG. 1 is a block diagram of an embodiment of a computing system 100 that includes point-to-point links that interconnect a set of components. In this example, the system 100 includes a cluster of three processors 102 and a system memory 104 coupled to a controller hub 106. In one embodiment, the controller hub may function as an upstream component (USC) in a PCIe link. The processors 102 may include any processing element, such as a microprocessor, a host processor, an embedded processor, a co-processor, or other processor. The processors 102 may be coupled to each other and to the controller hub 104 through a mesh of serial point-to-point links that may be termed a front-side bus (FSB) 108. In one embodiment, the FSB 108 is a high performance interconnect (HPI), such as quick path interconnect (QPI) or ultra-path interconnect (UPI) from Intel® corporation. In another embodiment, the FSB 108 includes a serial, point-to-point interconnect architecture that is compliant with a different interconnect standard, such as PCIe.

The system memory 104 includes any memory device, such as random access memory (RAM), non-volatile (NV) memory, or other memory accessible by devices in the system 100. The system memory 104 is coupled to the controller hub 106 through a memory interface 110. Examples of a memory interface include a double-data rate (DDR) memory interface, a dual-channel DDR memory interface, and a dynamic RAM (DRAM) memory interface.

In one embodiment, the controller hub 106 is a root hub, root complex, or root controller in a PCIe interconnection hierarchy. Examples of the controller hub 106 include a chipset, a memory controller hub (MCH), a northbridge, an interconnect controller hub (ICH) a southbridge, and a root controller/hub. Often the term chipset refers to two physically separate controller hubs, such as a memory controller hub (MCH) coupled to an interconnect controller hub (ICH). However, many current systems include the MCH integrated with the processors 102, while the controller hub 106 is to communicate with I/O devices. In some embodiments, peer-to-peer routing is optionally supported through the root complex of the controller hub 106.

In the example provided in FIG. 1, the controller hub 106 is coupled to an extension device or retimer 112 through link sub-segments 114A and 114B. For example, link sub-segment 114A carries data from the controller hub 106 to the retimer 112, and link sub-segment 114B which carries data from the retimer 112 to the controller hub 106. Each of the link sub-segments 114A and 114B may include a differential pair of lines that are used to carry the signal.

The input/output (I/O) modules 116 and 118, which may also be referred to as interfaces or ports, implement layered protocol stacks to provide communication between the controller hub 106 and the retimer 112 over the link sub-segments 114A and 114B. Further I/O modules 120 and 122 may couple the retimer 112 to a downstream component 124 through link sub-segments 126A and 126B.

The individual link sub-segments 114A, 114B, 126A, and 126B may form a link between devices. As used herein, a link is a single communications pathway between an upstream component (USC), such as the controller hub 106, and a downstream component, such as downstream component (DSC) 124. Although a single retimer 112 is shown in FIG. 1, two or more retimers may be used to form a single link, for example, including six link sub-segments. The link may include multiple lanes, each with a receive link sub-segment and a transmit sub-segment. As used herein, each link sub-segment 114A, 114B, 126A, and 126B may include a pair of lines that carry data by differential signal.

The retimer 112 routes packets/messages from the downstream component 124 upstream, e.g., up a hierarchy towards a root complex, to the controller hub 106 and downstream, e.g., down a hierarchy away from a root complex, from the processors 102 or the system memory 104 to the downstream component 124. The downstream component 124 may include any internal or external device or component to be coupled to an electronic system, such as an storage network, a processor cluster, a network processor, a hard-drive, a storage device, an I/O device, a Network Interface Controller (NIC), an add-in card, an audio processor, a CD/DVD ROM, a monitor, a printer, a mouse, a keyboard, a router, a portable storage device, a Firewire device, a Universal Serial Bus (USB) device, a scanner, and other input/output devices. The downstream component 124 may be referred to as an endpoint in the PCIe vernacular. Endpoint devices in PCIe are often classified as legacy, PCIe, or root complex integrated endpoints.

A graphics accelerator 128 may also be coupled to the controller hub 106 through the link sub-segments 130A and 130B. In this example, the link sub-segments 130A and 130B may form the link itself, as no retimers are present. The graphics accelerator 128 may be coupled to an MCH, which may be coupled to an ICH. The controller hub 106, and accordingly the downstream component 124, may then be coupled to the ICH. I/O modules 132 and 134 may be used to implement layered protocol stacks to communicate between the graphics accelerator 122 and the controller hub 106. Similar to the MCH discussion above, a graphics controller or the graphics accelerator 122 may be integrated with the processors 102.

In embodiments described herein, the I/O modules 116, 118, 120, 122, 132, and 134 may include circuitry that implements a testing procedure to allow errors in individual link sub-segments 114A, 114B, 126A, 126B, 130A, and 130B to be identified. In one embodiment, the link sub-segments can be tested during a test sequence termed an extended loopback (ELB) state. As described herein, during the ELB state, test messages that include known bit sequences are sent across the link, with each device sending the known or expected values to the next device, regardless of the values received from the last device.

A series of reporting messages are intermittently sent across the link, wherein each reporting message corresponds to a single link sub-segment, such as link sub-segments 114A, 114B, 126A, and 126B for the link between the controller hub 106 and the DSC 124. The downstream or receiving device for each link sub-segment reports error in the bit sequences received and returns the reporting message to the initiating device, termed the ELB master. In another embodiment, the reporting messages are periodically sent during normal operations, wherein the devices report parity errors and other errors in normal messages.

Figures 2A, 2B:
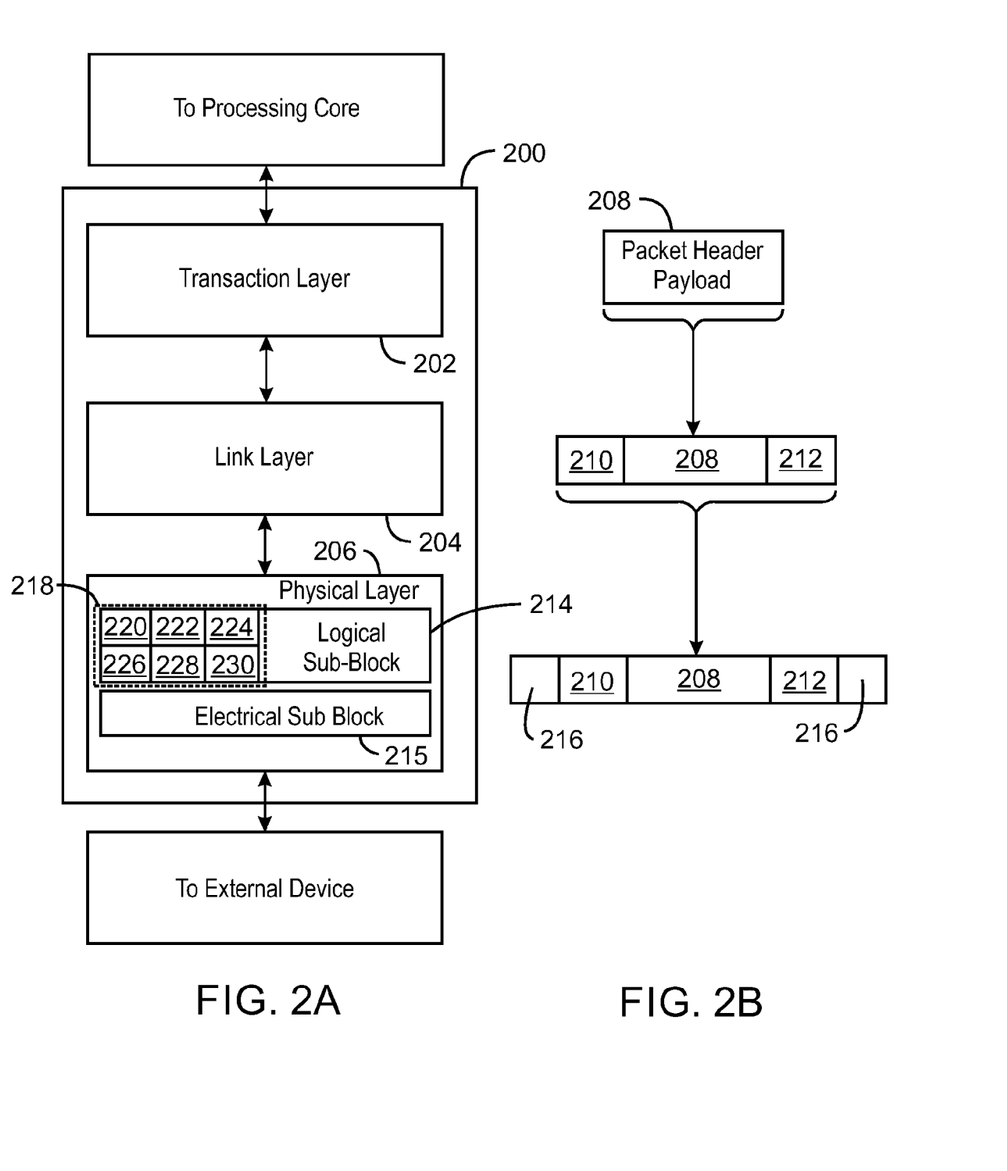
FIGS. 2A and 2B are block diagrams of an embodiment of a layered protocol stack.

FIGS. 2A and 2B are block diagrams of an embodiment of a layered protocol stack 200. The layered protocol stack 200 may include any form of a layered communication stack, such as an HPI stack, a PCIe stack, an IDI stack, or other layered stack. Although the discussions herein are related to a PCIe stack, the same concepts may be applied to other interconnect stacks. In one embodiment, the protocol stack 200 is a PCIe protocol stack including a transaction layer 202, a link layer 204, and physical layer (PHY) 206. An interface, such as I/O modules 116, 118, 120, 122, 132, and 134 in FIG. 1, may include a communication protocol stack 200. As described herein, a communication protocol stack 200 may also be referred to as a module or interface that implements or includes a protocol stack.

PCI Express uses packets to communicate information between components. Packets are formed in the transaction layer 202 and data link layer 204 to carry the information from the transmitting component to the receiving component. As the transmitted packets flow through the other layers, they are extended with additional information necessary to handle packets at those layers. For example, a physical layer (PHY) 206 may add further information before communicating the packets to an attached device over a link.

At the receiving side the reverse process occurs and packets get transformed from their PHY 206 representation to the data link layer 204 representation and finally, for transaction layer packets, to the form that can be processed by the transaction layer 302 of the receiving device. In one embodiment, the transaction layer 202 is to provide an interface between a device's processing core and the interconnect architecture, such as data link layer 204 and PHY 206. In this regard, a primary responsibility of the transaction layer 202 is the assembly and disassembly of packets, i.e., transaction layer packets (TLPs). PCIe implements split transactions, e.g., transactions with request and response separated by time, allowing a link to carry other traffic while the target device gathers data for the response.

In addition PCIe utilizes credit-based flow control. The translation layer 202 typically manages credit-based flow control for TLPs. In this scheme, a device advertises an initial amount of credit for each of the receive buffers in the transaction layer 202. An external device at the opposite end of the link, such as a controller hub or other device, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

The PCIe may include four transaction address spaces that include a configuration address space, a memory address space, an input/output address space, and a message address space. The memory space transactions include one or more of read requests and write requests to transfer data to or from a memory-mapped location. Memory space transactions may be capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions, simply termed messages, are defined to support in-band communication between PCIe devices.

The transaction layer 202 may assembles packet header/payload 208. An example of a format for packet headers/payloads may be found in the PCIe specification at the PCIe specification website.

The data link layer 204, also referred to as a link layer 204, acts as an intermediate stage between transaction layer 202 and the PHY 206. The data link layer 204 may provide a reliable mechanism for exchanging transaction layer packets (TLPs) between two components in a link. One side of the data link layer 204 accepts TLPs assembled by the transaction layer 202, and appends a packet sequence identifier 210 to the packet header/payload 208, which may function as an identification number or packet number. The data link layer 204 may then calculate and append an error detection code, e.g., CRC 212, to the packet header/payload 208. In one embodiment, the CRC 212 may be used to detect errors in a link sub-segment, which may be reported to an upstream device. The data link layer 204 submits the modified TLPs to the PHY 206 for transmission across a physical to an external device.

In one embodiment, the PHY 206 includes a logical sub block 214 and an electrical sub-block 215 to physically transmit a packet to an external device. The logical sub-block 214 is responsible for the logical functions of the PHY 206. For example, the logical sub bock 214 may append special symbols termed frames 216 to a packet.

The logical sub-block 214 may include an ordered set (OS) generator 218, which can be used to control the link communications with a PHY in a downstream device. In one embodiment, the OS generator 218 can include a number of logical units to detect errors in link sub-segments. For example, the OS generator 218 may include a test logic module 220 to send reporting messages downstream through a link. Each reporting message may be associated with a link sub-segment in the link, and each reporting message may include a status region for the associated link sub-segment to report errors in data received. An analysis logic module 222 can be used to read the incoming reporting messages, locate errors in the individual link sub-segments, and record the errors. A reporting logic module 224 can be used by devices to set particular bit sequences in the reporting message to identify parity or bit errors received.

A loopback logic module 226 may be used to send a message that instructs downstream devices to enter an extended loop back (ELB) state that can be used to test the transmission of individual bits in each link sub-segment of a link. The loopback module 226 may also be used to instruct downstream devices of the expected pattern to be used for testing.

The OS generator 218 can include a test sequence logic module 228 that can send packets that include expected pattern to be used between devices. Each devices can send the expected pattern to a downstream device, regardless of any errors received from the upstream device.

After a predetermined number of patterns have been sent, the test logic module 220 can send out reporting messages to allow downstream devices to report errors, e.g., differences between the expected patterns and the actual received patterns. A comparison logic module 230 may be used to determine the differences.

In one embodiment, the test logic 220 can periodically send out the reporting packets during normal communications, such as during sync periods. Further, a link training and status state machine (LTSSM) may be used to instruct the link to enter the ELB state, for example, to test the link sub-segments as part of an initialization process after power on or to instruct the link to enter the ELB after errors are detected in link sub-segments.

The electrical sub-block 215 includes a transmitter and a receiver. The transmitter is supplied by logical sub-block 214 with symbols, which the transmitter serializes and transmits on to an external device. The receiver is supplied with serialized symbols from the external device and transforms the received signals into a bit-stream. The bit-stream is de-serialized by the electrical sub-block 215 and supplied to the logical sub-block 214.

As stated above, although transaction layer 202, link layer 210, and PHY 206 are discussed in reference to a specific embodiment of a PCIe protocol stack, in an embodiment the ELB testing mode can be used with an HPI protocol, for example, by periodically sending out packets during L0 traffic or by entering an ELB state during L0c. In fact, the testing modes described herein may be used to test link sub-segments in any number of protocols, such as PCIe, quick path interconnect (QPI) from Intel® corporation, universal serial bus (USB), and the like.

As an example, a port or interface that includes a layered protocol stack may include a first layer to assemble packets, such as a transaction layer 202. A second layer may sequence packets, such as a link layer 204. A third layer may transmit the packets, such as a PHY 206. In embodiments described herein, the PHY 206 may be modified by the addition of the test logic described herein.

Figure 3:
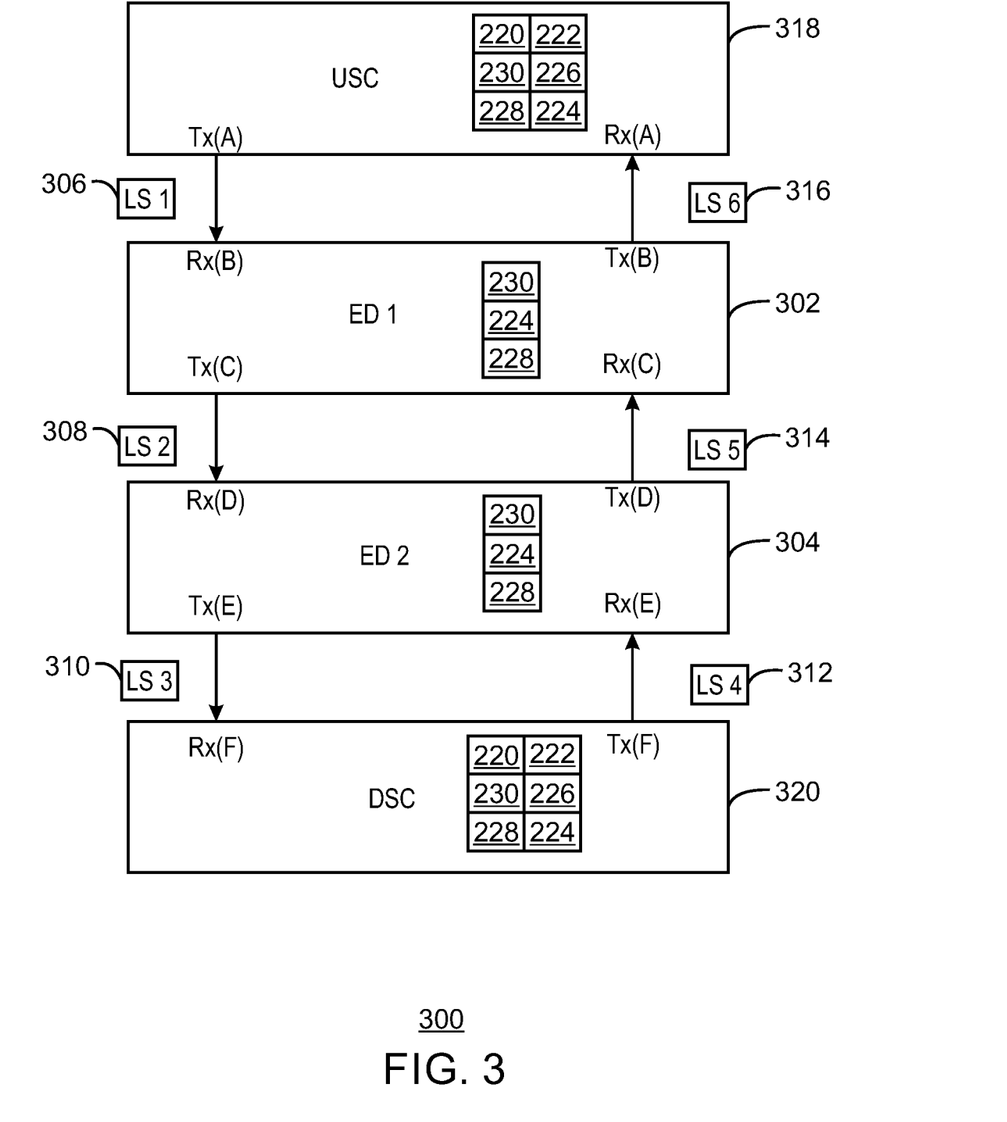
FIG. 3 is a block diagram of an embodiment of a link topology with two re-timers or extension devices (ED) in a link.

FIG. 3 is a block diagram of an embodiment of a link topology 300 with two re-timers or extension devices (ED) 302 and 304 in a link. Like numbered items are as described with respect to FIG. 2. In this example, the link is split into three link sub-segments (LS) 306, 308, 310, 312, 314, and 316 in each direction, e.g., downstream, from the upstream component (USC) 318 towards the downstream component (DSC) 320, or upstream from the DSC 320 towards the USC 318. It can be noted that the identification of the USC 318 and the DSC 320 are not fixed, but may vary, for example, depending on which component is functioning as an ELB master. Further, the logic described herein may also be used in cases where there are no EDs or more than two EDs in the link, as may be used in future developments.

As discussed herein, an enhanced loop back (ELB) state may be used to test the link and identify locations of errors in each of the link sub-segments 306, 308, 310, 312, 314, and 316. Entry to this state can be from normal communications, such as the L0 state, after the link goes through the training sequence of linking up for normal operation or through a dedicated state entry sequence.

One mechanism that may be used for state entry is a set of configuration register writes along with the expected pattern that the test wants to perform on a per-lane basis. The initiator then exchanges a training sequence with its link partner with an embedded command of going to the ELB state along with the expected pattern encoded. For example, in the PCIe protocol, this can be performed by setting Bit 5 of Symbol 5 of the TS1 ordered set during the Loopback-.Entry state. If multiple patterns are supported, some other fields can encode the pattern number on a per-lane basis on the training sequence. As an example, in PCIe, one can re-purpose the lower order bits of the NFTS (number of fast training sequences) field during Loopback.Entry for this purpose. It should be noted that this mechanism may be used to test a device using assumption based training, for example, using a tester or a test fixture, since entry to the ELB state is also controlled through the training sequence.

If the USC 318 is the ELB master, in the ELB state it may transmit a known repeating pattern. Different lanes may transmit different patterns which are communicated in some fashion such as in the Training Sets. Example patterns that can be used include clock patterns and various pseudo-random number bit sequence (PRBS) patterns. Any number of different pattern options could be specified. The pattern on each lane must be started at a defined location in the stream of data such as after a special marker ordered set. The example discussed herein illustrates the invention in the context of PCI Express with 128b/130b encoding, although, as described it may be used with any encoding scheme or protocol.

For reporting error information by each LS 306-316, some of the periodic link maintenance patterns may be modified, such as a Sync Header in PCI Express, SKP ordered sets in PCI Express, or L0c flits in KTI or a new error reporting packet may be defined an used for the ELB mode. For example, in PCI Express, an enhanced SKP ordered set may be used to replace the existing SKP ordered set. Instead of sending two back to back SKP ordered sets, as in current operations, the ELB master may send six back to back enhanced SKP ordered sets periodically, e.g., one for each LS 306-316. As part of the initial training, each ED 302 and 304 knows its exact location within the link and hence the link sub-segment numbers. Any errors detected by the receiver of a LS 306-316 are reported in the associated enhanced SKP ordered set. For example, the Receiver of LS 3, e.g., the DSC 320 in this example, reports its errors, if any, in the 3rd enhanced SKP ordered set of the 6 enhanced SKP ordered sets.

In addition to sending out specific reporting messages, a dedicated portion of the repeating pattern may be used for each receiver to report its error information since the last reporting. The receiver performs the comparison between the received data pattern and the expected data pattern, and reports any departure from the expected patterns as bit errors in the maintenance bits.

The USC 318 and the DSC 320 may include a complete set of logic modules 220, 222, 224, 226, 228, and 230, allowing either component 318 or 320 to act as an ELB master. However, the retimers, extension devices 302 and 304, may not include all of the logic modules, since they will generally not act as an ELB master. For example, the EDs 302 and 304 may only include a test sequence logic module 228, a comparison logic module 230, and a reporting logic module 224. This provides the capability of detecting and reporting errors in received data, while sending an expected pattern on to a downstream device.

Figure 4:
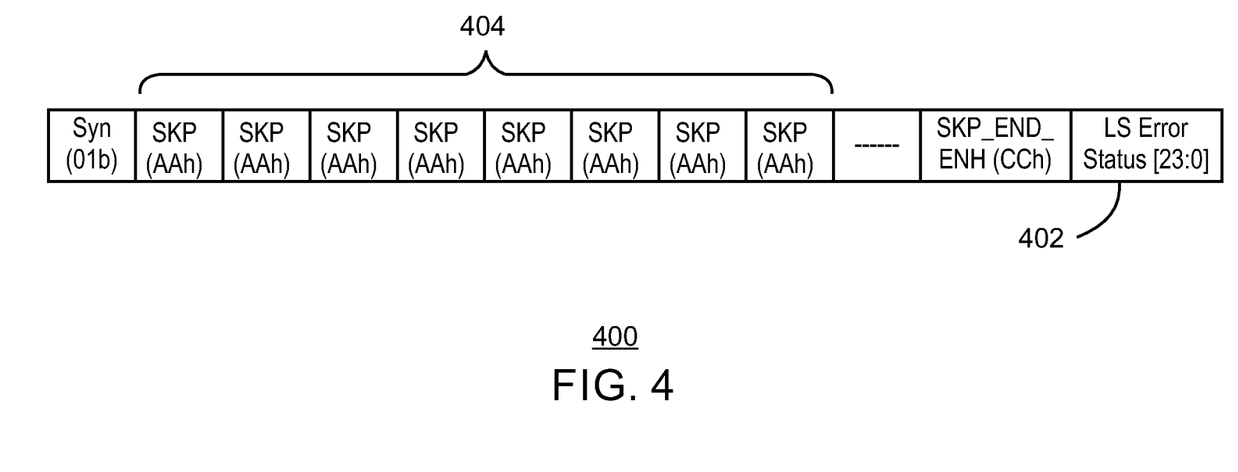
FIG. 4 is a block diagram of an embodiment of a potential layout for an enhanced SKP ordered set.

FIG. 4 is a block diagram of an embodiment of a potential layout for an enhanced SKP ordered set 400. The ELB mechanism may use control and status registers for reporting error information gathered from the enhanced SKP ordered sets to higher levels of the protocol stack. To enter to the enhanced Loopback state, a CSR bit per link may be used, for example, with other existing bits, to direct the link to enter the ELB state, for example, from training or the L0 state. Other CSR bits may be used to select the pattern per lane if multiple patterns are supported.

The enhanced SKP ordered set may include a bit region termed LS Error Status 402, which may include a number of status bits that may be used to report errors. The LS Error Status 402 shown in FIG. 4 uses 23 bits, which may be defined as shown in Table 1. One bit may be used to indicate that the lane has encountered an error. This bit may be cleared after software has read the status bits. Further, a number of bits may be used to capture the first error, which can be either on a per-lane basis or on a per-link basis. It should be noted that, while reporting only the first error location per lane per link sub-segment is described for simplicity, the technique can easily be extended to track and report multiple errors by using additional SKP ordered sets or defining new error reporting packets and structures for use with the ELB mode.

The bits can include a sequence number for the set of six enhanced SKP ordered sets, for example, to identify in which block sequence of test patterns the first error happened. Other bits may indicate the link sub-segment, for example, if multiple enhanced SKP ordered sets report error, a simple tie-breaker of just going by the first LS that detected an error or can be something more sophisticated to look at the lowest bit position reported across the contiguous consecutive enhanced SKP ordered sets. Finally, some bits may be used to track the cumulative number of errors. In one embodiment, the enhanced SKP ordered set includes the expected test pattern in the symbols 404 preceding the error reporting bits. In this embodiment, no separate enhanced SKP ordered sets may be sent, as each receiver can immediately report errors in the previously received enhanced SKP ordered set.

Note that using multiple SKP ordered sets and the specific error encoding shown is only one example of the general idea of reporting error information. The use of SKPs has the advantage of potentially being used even during L0 normal operation, but other symbols, number of symbols, and encoding with more/alternate information could be defined for the ELB mode.

The number of fixed data patterns to be sent in the ELB master can be a pre-determined number or it can be run indefinitely until a specific command is sent to exit the ELB state. This information will be communicated in the training sequence by the ELB master. If testing is set to proceed for a pre-determined number of patterns, the link can automatically go back to L0. In the context of a link such as PCI Express, that means the link may not have to be reset and reconfigured by system software.

TABLE 1

Error Status Bits within the Enhanced SKP ordered set during ELB for PCI Express

| Bit Position in LS_Error_Status [23:0] | Name | Function | Default from ELB Master |
|---|---|---|---|
| 0 | LS_i Ownership | Set by each LS in the Enhanced SKP Ordered Set Position it owns | 1'b0 |
| 9:1 | First Block Error | First Block where the error occurred, if any, reported by the LS Owner of the Enhanced SKP Ordered Set owner | 9'h1FF |
| 17:10 | First error's bit position within the Block | This is the bit position (out of 130 bits) where the first error occurred within the block | 8'h03 |
| 21:18 | Error Count | Total Number of Symbol Errors encountered by the LS that owns this Enhanced SKP OS (a value of 15 indicates >=15 errors; less than 15 indicates the exact number of errors) | 4'h 0 |
| 22 | Alignment loss | Indicates loss of bit lock, Symbol/Block lock, or any other severe receiver error | 1'b 0 |
| 23 | Even Parity | XOR of bits 22:0 | 1'b 1 |

Figure 5:
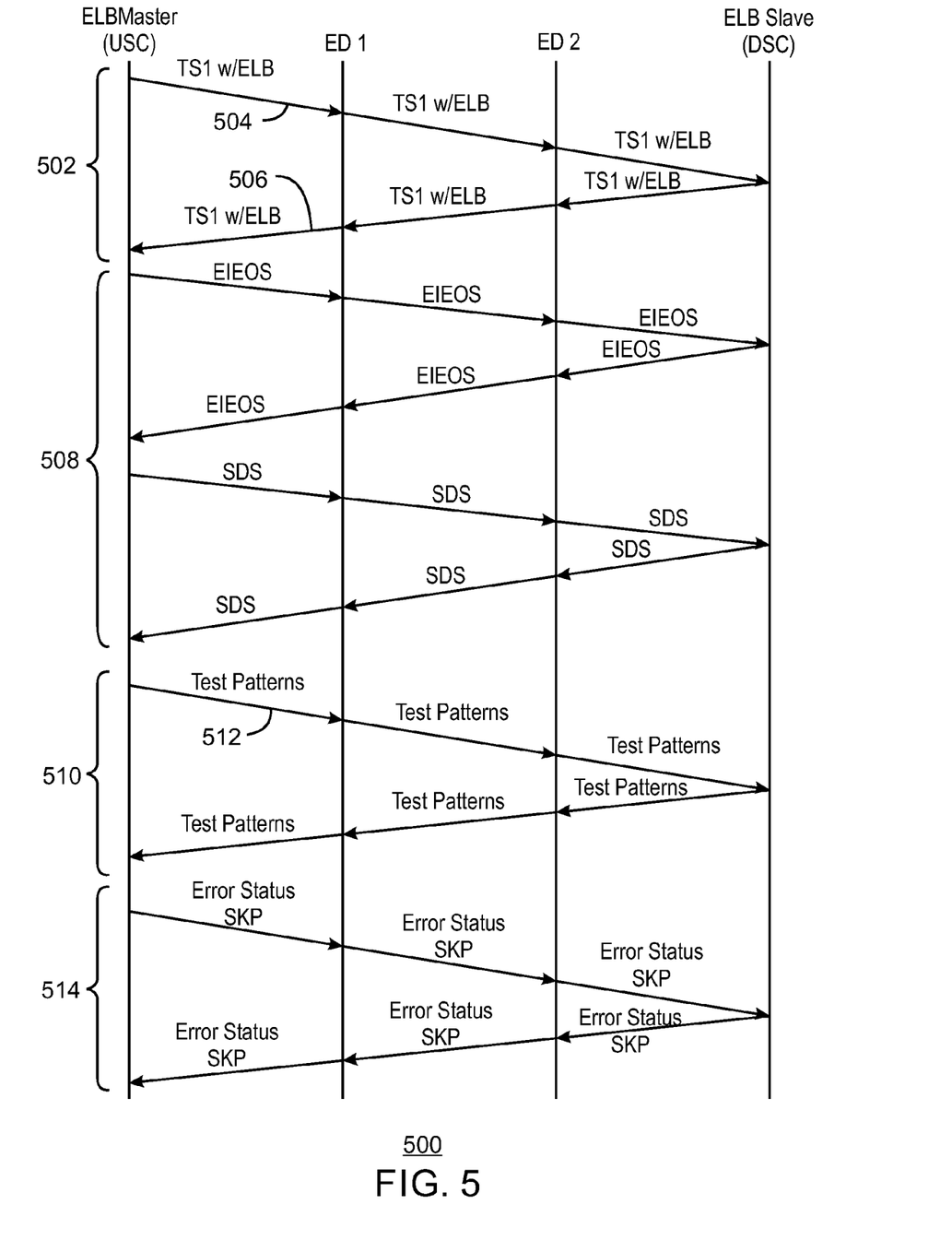
FIG. 5 is a ladder diagram illustrating communications that may take place during an extended loopback testing operation.

FIG. 5 is a ladder diagram illustrating communications that may take place during an extended loopback testing operation. Although the example discussed herein is for PCIe, the communications in the ladder diagram may be modified to apply to a number of different protocols. In this example, two extension devices, or retimers, ED1 and ED2 are present.

A first set 502 of communications is used to enter the ELB state. An ELB master, such as the upstream component (USC) sends a sequence of commands 504 down the link instructing each of the downstream devices to enter the ELB state. The commands may take the form of TS1 ordered sets in which a bit indicates that the devices should enter the ELB state. The downstream devices, including the ELB slave, or downstream component, respond by looping back the TS1 ordered sets 506, indicating that they are entering the ELB state.

To mark the beginning 508 of the test phase, the ELB master may send an electrical idle exit ordered set (EIEOS) followed by the start data stream (SDS) ordered set. These may act as a marker for each receiver along the way to indicate that the predetermined pattern will follow. Further, these ordered sets can be used to reset the scrambler in each receiver.

During the testing phase 510, the ELB master sends the selected pattern 512, for example, on possible pattern could be as data blocks with data_in=0 to the LFSR (linear feedback shift register). Thus, each lane simply sends out the LFSR value it has as the payload of the data blocks with the normal rules applied to the LFSR and encoding logic. Each receiver compares each incoming data bit in the data blocks to its LFSR value and identifies errors in the exact bit location. Each transmitter transmits the LFSR value in the data block instead of sending the received data block, which prevents an error in a link sub-segment from propagating further, and confusing the error determination. Each receiver records the error position of the first error as well as the number of errors for each lane since the last time it reported errors.

After a block of test patterns have been sent, e.g., 192, 375, or any other number of test patterns, the link may enter a reporting phase 514. During the reporting phase 514, a series of enhanced SKP ordered sets, for example, as described with respect to FIG. 4, are sent down the link, one for each link sub-segment. The receivers in each of the devices report errors in the prior link sub-segment by setting the bit values in a reporting region, for example, as described above.

As described herein, portions of the ELB testing mechanism can also be used during normal link operation, for example, in L0, to allow locations of some errors during normal operation to be reported and tied to specific link sub-segments. Each lane sends out a parity or CRC signature of the data bits transmitted so far in a special pattern. This can be through the parity bit in the SKP ordered sets in PCI Express or through L0c in KTI. However, this mechanism may not work well when a framing error causes the link to retrain. The techniques described herein would protect Data Blocks across retraining by sending an enhanced SKP ordered set when the training has stabilized (e.g., prior to sending the SDS ordered set in PCI Express) before the link transitions to L0.

Figure 6:
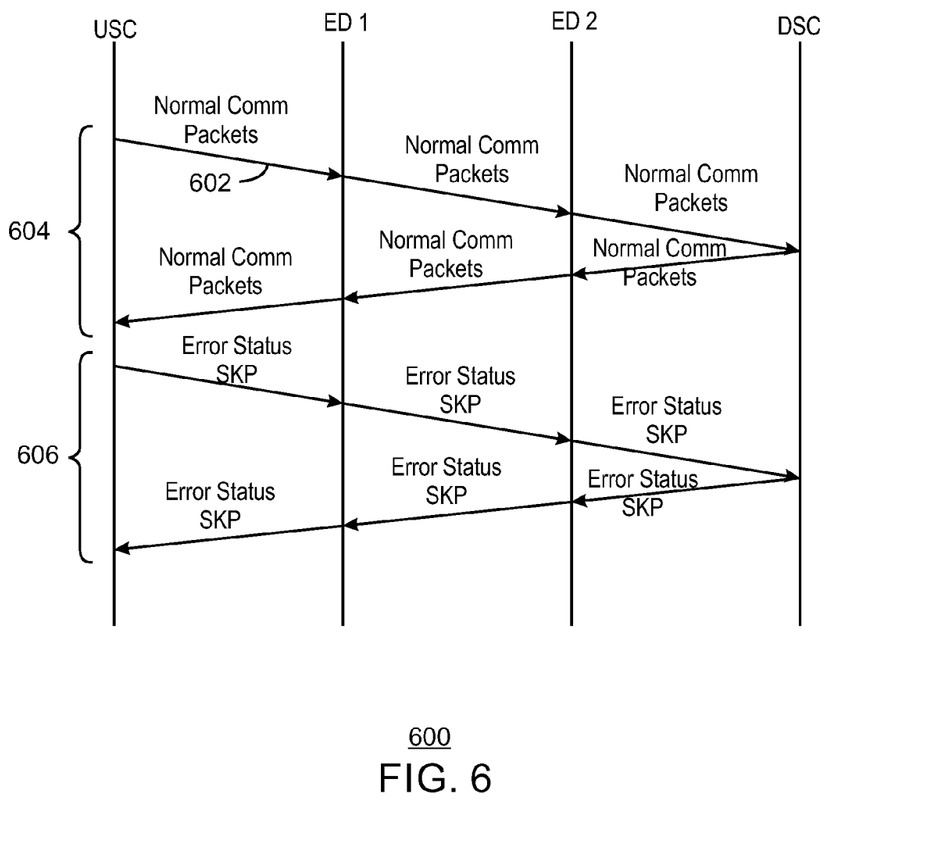
FIG. 6 is a ladder diagram illustrating communications that may take place during a training phase or during normal operations.

FIG. 6 is a ladder diagram illustrating communications that may take place during a training phase or during normal operations. In this procedure, normal communications packets 602 are sent during a communications phase 604. The communications packets 602 may include parity bits, for example, in the CRC 212, which allow the identification of parity errors during transmission over a link sub-segment. Periodically, for example, during a link synchronization, a set of enhanced SKP ordered sets may be sent 606 across the link. Instead of sending one or two SKP ordered sets, the number of enhanced SKP ordered sets is determined by the number of link sub-segments.

The format of the enhanced SKP ordered set is delineated in Table 2 below and is slightly different than the example for the ELB state described above. Identification of errors in a link sub-segment during normal communications enables devices to check which lane may have contributed to a link Retraining/Recovery and also enables EDs to report if they had encountered the error.

The ability of EDs to report an error condition not only helps to log the error, but also provides a mechanism for the EDs to request link retraining and recovery. This may allow the EDs to communicate the error without using other measures, such as changing the data blocks mid-stream or injecting errors, which may cause potential data corruption.

TABLE 2

Format of an Enhanced SKP Ordered Set during Retraining/Recovery

| Symbol(s) | Value | Comments |
| --- | --- | --- |
| 0 ... 4N-5 | SKP | N = 2, 3, 4, 5 |
| 4N-4 | SKP_END_ENHANCED | Signals Enhanced SKP Ordered Set will end 3 Symbols after this one |
| 4N-3, 4N-2 | LFSR[23:8] | One can infer the LFSR[23:0] from LFSR[23:7] since the SKP Ordered sets always carry the LFSR at the 128-bit aligned boundary |
| 4N-1 | 7: LFSR 7<br>6: Parity<br>5: ED2 Serious error in same direction<br>4: ED2 Parity error in opposite direction<br>3: ED2 Parity error in same direction<br>2: ED1 Serious error in same direction<br>1: ED1 Parity error in opposite direction<br>0: ED1 Parity error in same direction | For error reporting: same 'Direction' refers to if a parity error was detected by the receiver that is modifying the Enhanced SKP Ordered Set; opposite refers to if the Enhanced SKP Ordered Set is used to report an error seen by the other Receiver; A serious error would cause the link to go to Recovery/Retraining |

For error logging, each lane needs to have a bit indicating an error log, and the first link sub-segment that observed the error. It may also have an error bit per link sub-segment and an error count per lane or per link sub-segment.

Figure 7:
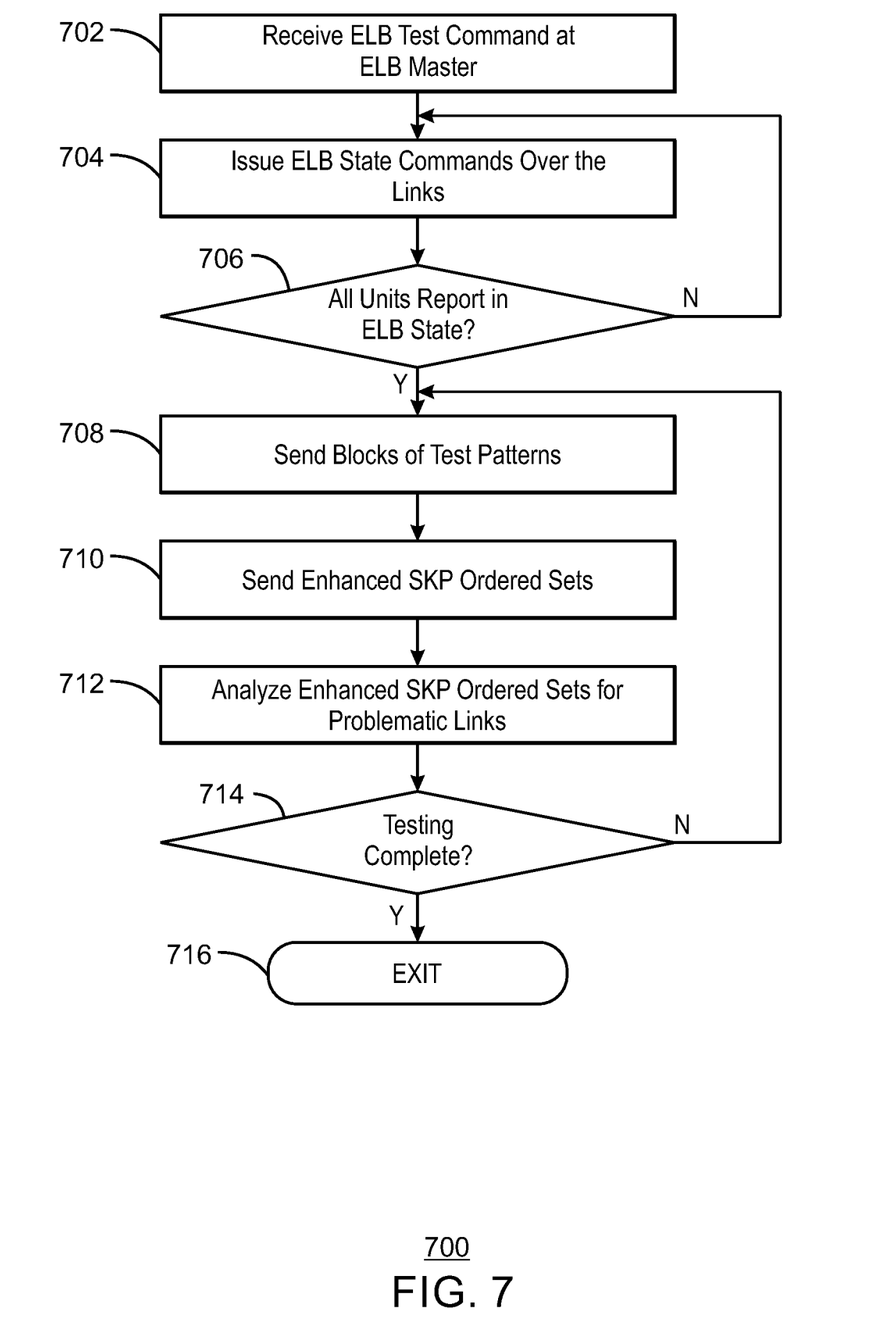
FIG. 7 is a process flow diagram of a method for an extended loopback testing of a link.

FIG. 7 is a process flow diagram of a method for an extended loopback testing of a link. The process 700 begins at block 702 with the device that will be the ELB master receiving a command to initiate an ELB state for a link. At block 704, the ELB master sends a series of commands over the link to have all devices enter an ELB state. As described herein, the command may be a TS1 ordered set in the PCIe protocol. The command is repeated until at block 706 it is determined that all devices have responded and are in the ELB state.

Once all devices have responded, at block 708 blocks of test patterns are sent over the link. Any number of test patterns may be sent, for example, 128, 256, 375, or more. Each device sends out the test pattern that is expected by the next device, regardless of any errors in the test pattern received from the last device. Differences between the expected test patterns and the received test patterns are used to identify errors in a link sub-segment.

At block 710, enhanced SKP ordered sets are sent over the link, wherein one enhanced SKP ordered set is sent for each link sub-segment. The devices report reception errors by bit changes in the enhanced SKP ordered sets, and return the sets to the ELB master. The ELB master records the errors reported and may identify problematic links from the information. In one embodiment, the error reporting bits of each of the test pattern ordered sets are used to report errors. In this embodiment, the actions in blocks 708 and 710 are combined and no separate error reporting messages are needed.

At block 714, a determination is made as to whether testing is completed. For example, the testing may be repeated for a preset number of iterations, or testing may be interrupted to resume normal communications. If testing is not complete, process flow resumes at block 708. If testing is completed, the method 700 is exited at block 716, for example, with the resumption of normal communications, with entry into a powered down stated, or entry into another state.

Figure 8:
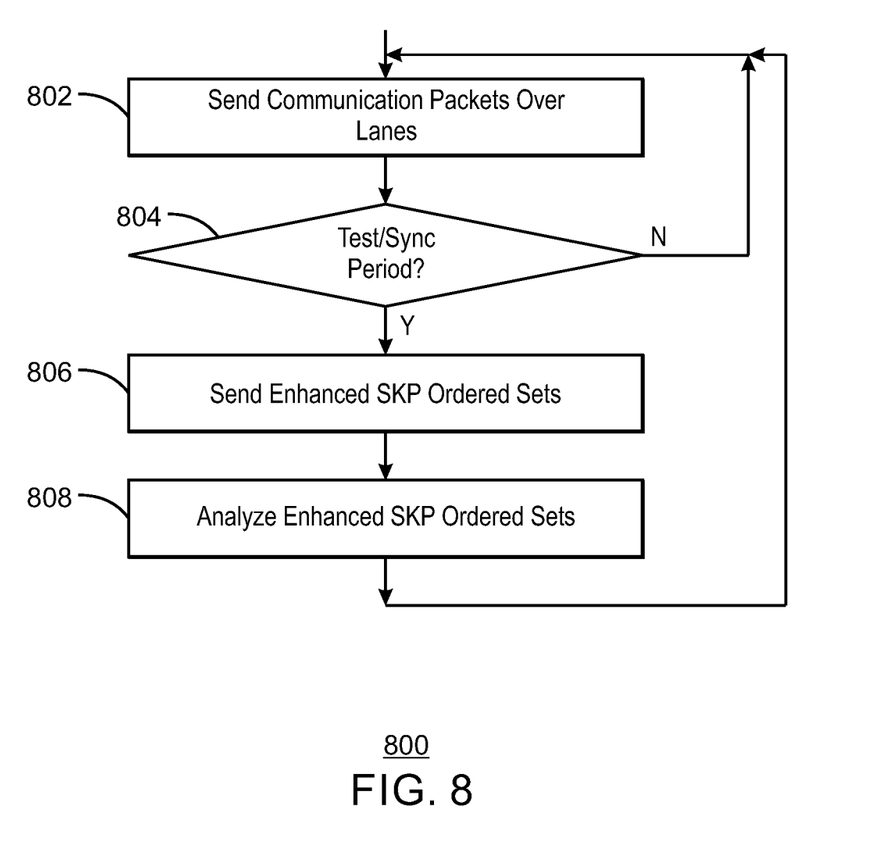
FIG. 8 is a process flow diagram of a method for testing links during normal communications.

FIG. 8 is a process flow diagram of a method 800 for testing links during normal communications. The method 800 begins at block 802 with the sending of communication packets over the link. The communication packets may have parity bits, or other information, set by each device that can be used to identify parity or other errors during the transmission of the packets to a downstream receiving device on a link sub-segment.

At block 804, a determination is made as to whether a test or sync period is needed. This can be triggered by detection of some issue on the link or may be a routine procedure occurring when a clock difference between transmitter and receiver necessitates the sending of SKP ordered sets to allow synchronization. If no test or sync period is needed, process flow returns to block 802 to continue communications.

If a test or sync period is needed, as determined at block 804, at block 806 an upstream component sends enhanced SKP ordered sets over the link, with one enhanced SKP ordered set associated with each link sub-segment. Each device in the link, such as a retimer or a downstream component, reports errors in received data by setting bits in an enhanced SKP ordered set associated with that link sub-segment. The enhanced SKP order sets are looped back to the upstream component which analyzes the enhanced SKP ordered sets and records the errors. Process flow may then resume at block 802, with the resumption of communications. In one embodiment, the identification of parity errors in one or more link sub-segments may trigger the entry into an ELB state to further identify and locate the errors.

Examples may include subject matter such as systems and methods that provide test logic for a high speed serial interconnect. The test logic can be used in normal communications to identify parity errors in link sub-segments, or in an extended loop back state to identify bit level transmission errors according to embodiments and examples described herein.

Example 1 is an apparatus that includes a serial interconnect, wherein the serial interconnect includes test logic to send a number of reporting messages, wherein each reporting message is associated with a link sub-segment in a link in the serial interconnect, and each reporting message comprises a status region for the associated link sub-segment to report transmission errors. The test logic also includes analysis logic to record errors in the link sub-segment.

The apparatus may include reporting logic to change bit sequences in the status region to report transmission errors. The status region may include parity error reports during normal communication operations and bit transmission error reports during an extended loop back state.

The apparatus may include loop back logic to send a message on the link to instruct each device in the link to enter an extended loop back (ELB) state. Further, the apparatus may include an ELB master, an ELB slave, or both. The apparatus may include test sequence logic to send a test message across a link sub-segment, wherein the test message comprises an expected pattern, and the expected pattern is sent downstream from a unit across a next link sub-segment in the link. The apparatus may include comparison logic to compare a received pattern to an expected pattern to identify transmission errors.

The test logic may include hard wired logic. Further, the test logic may include a program in a microcontroller.

The apparatus may include a peripheral component interconnect express (PCIe) protocol stack. An extension device may be used, wherein the extension device includes reporting logic to change bit sequences in an enhanced SKP order set associated with an upstream link sub-segment if errors are detected in data received over the upstream link sub-segment. An extension device may include comparison logic to compare a received bit pattern to an expected bit pattern.

The apparatus may include a high performance interconnect (HPI) protocol stack. Further, the apparatus may include a computing system. The apparatus may also include a processor.

Example 2 is a method for testing a serial interconnect. The method includes sending a number of reporting messages across a link in the serial interconnect, wherein each reporting message is associated with a link sub-segment in the link. The reporting messages are received at an upstream component. Errors are identified in a link sub-segment based on bit sequences in a reporting region of a reporting message associated with the link sub-segment.

The reporting region may be analyzed to identify parity errors in link sub-segments.

The method may include instructing all devices in a link to enter an extended loop back (ELB) state. The method may include sending blocks of expected test patterns across link sub-segments in the ELB state. The reporting region may be analyzed to identify bit transmission errors in link sub-segments.

The method may include sending parity information in messages during normal communications. The method may include changing bits in the reporting region to report parity errors in a message. The method may include analyzing the reporting region to identify bit transmission errors in link sub-segments.

Example 3 includes an integrated circuit chip comprising a serial interconnect. The serial interconnect includes test logic to send a number of reporting messages across a link, wherein each reporting message is associated with a link sub-segment in a link in the serial interconnect. Analysis logic may record errors in the link sub-segment.

The serial interconnect may include reporting logic to change bit sequences in the status region to report transmission errors. The status region may include parity error reports during normal communication operations and bit transmission error reports during an extended loop back state.

The serial interconnect may include loop back logic to instruct all devices in a link to enter an extended loop back (ELB) state. Further, the serial interconnect may include test sequence logic to send a test message across a link sub-segment, wherein the test message comprises an expected pattern, and the expected pattern is sent downstream from a unit across a next link sub-segment in the link. The serial interconnect may also include comparison logic to compare a received pattern to an expected pattern to identify transmission errors.

The integrated circuit chip may include a peripheral component interconnect express (PCIe) protocol stack. The integrated circuit chip may include a high performance interconnect (HPI) protocol stack.

Example 4 is a tangible, non-transitory, computer-readable medium including code to direct a processor to send a number of reporting messages across a link in a serial interconnect, wherein each reporting message is associated with a link sub-segment in the link. The reporting messages are received at an upstream component. Errors in a link sub-segment are identified based on bit sequences in a reporting region of a reporting message associated with the link sub-segment.

The tangible, non-transitory, computer-readable medium may include code to direct the processor to analyze the reporting region to identify parity errors in link sub-segments.

The tangible, non-transitory, computer-readable medium may include code to direct the processor to instruct all devices in a link to enter an extended loop back (ELB) state. The tangible, non-transitory, computer-readable medium may include code to direct the processor to send blocks of expected test patterns across link sub-segments in the ELB state. The tangible, non-transitory, computer-readable medium may include code to direct the processor to compare an expected test pattern to a received bit pattern to determine if bit errors occurred during the transmission. The tangible, non-transitory, computer-readable medium may include code to direct the processor to analyze the reporting region to identify bit transmission errors in link sub-segments.

The tangible, non-transitory, computer-readable medium may include code to direct the processor to change bits in the reporting region to report errors in the bit transmission.

The tangible, non-transitory, computer-readable medium may include code to direct the processor to send parity information in messages during normal communications. The tangible, non-transitory, computer-readable medium may include code to direct the processor to change bits in the reporting region to report parity errors in a message.

Example 5 is a method of testing a serial interconnect. The method includes sending a number of reporting messages across a link in the serial interconnect, wherein each reporting message is associated with a link sub-segment in the link. The reporting messages are received at an upstream component. Errors are identified in a link sub-segment based on bit sequences in a reporting region of a reporting message associated with the link sub-segment.

The method may include instructing all devices in a link to enter an extended loop back (ELB) state. Blocks of expected test patterns may be sent across link sub-segments in the ELB state. An expected test pattern may be compared to a received bit pattern to determine if bit errors occurred during the transmission, and bits may be changed in the reporting region to report errors in the bit transmission.

The method may include sending parity information in messages during normal communications. The method may include changing bits in the reporting region to report parity errors in a message.

The method may include identifying bit transmission errors in link sub-segments from the reporting region.

Example 6 is an apparatus including a serial interconnect, wherein the serial interconnect may include: test logic to send a number of reporting messages, wherein each reporting message is associated with a link sub-segment in a link in the serial interconnect. Each reporting message may include a status region for the associated link sub-segment to report transmission errors. Analysis logic may record errors in the link sub-segment.

The apparatus may include loop back logic to send a message on the link to instruct each device in the link to enter an extended loop back (ELB) state. Test sequence logic may be included to send a test message across a link sub-segment, wherein the test message may include an expected pattern. The expected pattern may be sent downstream from a unit across a next link sub-segment in the link. Comparison logic may be used to compare a received pattern to an expected pattern to identify transmission errors. Reporting logic may be used to change bit sequences in the status region to report transmission errors.

The status region may include parity error reports during normal communication operations and bit transmission error reports during an extended loop back state.

The apparatus may include hard wired logic, a program in a microcontroller, or both. The apparatus may include a peripheral component interconnect express (PCIe) protocol stack. The apparatus may include an extension device, wherein the extension device may include reporting logic to change bit sequences in an enhanced SKP order set associated with an upstream link sub-segment if errors are detected in data received over the upstream link sub-segment.

The apparatus may include an extension device, wherein the extension device may include comparison logic to compare a received bit pattern to an expected bit pattern. The apparatus may include a high performance interconnect (HPI) protocol stack.

While the present techniques have been described with respect to a limited number of embodiments, those skilled in the art will appreciate numerous modifications and variations therefrom. It is intended that the appended claims cover all such modifications and variations as fall within the true spirit and scope of this present techniques.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present techniques.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals), and the like, which are to be distinguished from the non-transitory mediums that may receive information there from.

Instructions used to program logic to perform embodiments of the techniques may be hard coded within circuitry in each of the units described. Further, the logic may be stored within a memory in the system, such as a microcontroller memory, a DRAM, a cache, a flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
    test logic to send a plurality of reporting messages, wherein a reporting message is to be associated with a sub-segment of transmitters to be coupled to a serial interconnect, and the reporting message comprises a status region for the associated sub-segment to report transmission errors; and
    analysis logic to record errors in the sub-segment.

2. The apparatus of claim 1, comprising reporting logic to change bit sequences in the status region to report transmission errors.

3. The apparatus of claim 1, wherein the status region comprises parity error reports during normal communication operations, and wherein the status region comprises bit transmission error reports during an extended loop back state.

4. The apparatus of claim 1, comprising loop back logic to send a message on a link to instruct each device in the link to enter an extended loop back (ELB) state.

5. The apparatus of claim 4, comprising an ELB master.

6. The apparatus of claim 4, comprising an ELB slave.

7. The apparatus of claim 4, comprising test sequence logic to send a test message across a link sub-segment, wherein the test message comprises an expected pattern and the expected pattern is sent downstream from a unit across a next link sub-segment in the link.

8. The apparatus of claim 7, comprising comparison logic to compare a received pattern to an expected pattern to identify transmission errors.

9. The apparatus of claim 1, comprising hard wired logic.

10. The apparatus of claim 1, comprising a program in a microcontroller.

11. The apparatus of claim 1, comprising a peripheral component interconnect express (PCIe) protocol stack.

12. The apparatus of claim 11, comprising an extension device, wherein the extension device comprises reporting logic to change bit sequences in an enhanced SKP order set associated with an upstream link sub-segment if errors are detected in data received over the upstream link sub-segment.

13. The apparatus of claim 11, comprising an extension device, wherein the extension device comprises comparison logic to compare a received bit pattern to an expected bit pattern.

14. The apparatus of claim 1, comprising a high performance interconnect (HPI) protocol stack.

15. The apparatus of claim 1, comprising a computing system.

16. The apparatus of claim 1, comprising a processor.

17. A method of testing a serial interconnect, comprising:
    sending a plurality of reporting messages across a link in the serial interconnect, wherein each reporting message is associated with a link sub-segment in the link;
    receiving the plurality of reporting messages at an upstream component; and
    identifying errors in a link sub-segment based on bit sequences in a reporting region of a reporting message associated with the link sub-segment.

18. The method of claim 17, comprising analyzing the reporting region to identify parity errors in link sub-segments.

19. The method of claim 17, comprising instructing all devices in a link to enter an extended loop back (ELB) state.

20. The method of claim 19, comprising sending blocks of expected test patterns across link sub-segments in the ELB state.

21. The method of claim 19, comprising analyzing the reporting region to identify bit transmission errors in link sub-segments.

22. Test logic in a serial interconnect, comprising circuitry to:
    send a plurality of reporting messages across a link, wherein each reporting message is associated with a link sub-segment in a link in the serial interconnect;
    receive the plurality of reporting messages at an upstream component; and
    identify errors in a link sub-segment based on bit sequences in a reporting region of a reporting message associated with the link sub-segment.

23. The test logic of claim 22, comprising circuitry to analyze the reporting region to identify parity errors in link sub-segments.

24. The test logic of claim 22, comprising circuitry to instruct all devices in a link to enter an extended loop back (ELB) state.

25. The test logic of claim 22, comprising circuitry to send blocks of expected test patterns across link sub-segments in the ELB state.

* * * * *